(12) United States Patent
Tiedemann et al.

(10) Patent No.: US 11,574,751 B2
(45) Date of Patent: Feb. 7, 2023

(54) VOLTAGE-DIVIDER CIRCUITS AND CIRCUITRY

(71) Applicant: SOCIONEXT INC., Kanagawa (JP)

(72) Inventors: Dierk Tiedemann, Braunschweig (DE); Niklas Linkewitsch, Braunschweig (DE)

(73) Assignee: SOCIONEXT INC., Kanagawa (JP)

( * ) Notice: Subject to any disclaimer, the term of this patent is extended or adjusted under 35 U.S.C. 154(b) by 404 days.

(21) Appl. No.: 16/721,193

(22) Filed: Dec. 19, 2019

(65) Prior Publication Data

US 2020/0203045 A1 Jun. 25, 2020

(30) Foreign Application Priority Data

Dec. 21, 2018 (EP) .................................... 18215714

(51) Int. Cl.
*H01C 13/02* (2006.01)
*G01R 15/04* (2006.01)
(Continued)

(52) U.S. Cl.
CPC .............. *H01C 13/02* (2013.01); *G01R 15/04* (2013.01); *H03M 1/78* (2013.01); *H03M 1/80* (2013.01); *H03M 1/808* (2013.01); *G01R 15/14* (2013.01)

(58) Field of Classification Search
CPC ........ H01C 13/02; G01R 15/04; G01R 15/14; H03H 7/24; H03M 1/808; H03M 1/80; H03M 1/785; H03M 1/78
See application file for complete search history.

(56) References Cited

U.S. PATENT DOCUMENTS 3,513,417 A * 5/1970 Worcester ................ H03H 7/24
333/81 R
4,912,394 A 3/1990 Sugimoto et al.
(Continued)

FOREIGN PATENT DOCUMENTS

EP     0 501 121 A2   9/1992
JP     S57-92919 A    6/1982
(Continued)

OTHER PUBLICATIONS

Communication pursuant to Article 94(3) EPC issued in corresponding European Application No. 18 215 714.9, dated Dec. 23, 2021.
(Continued)

*Primary Examiner* — Jung Kim
(74) *Attorney, Agent, or Firm* — McDermott Will & Emery LLP

(57) ABSTRACT

A voltage-divider circuit, including: a network of discrete resistors defining T tiers of resistors, where T≥2, the T tiers comprising first and subsequent tiers, the Xth tier including at least one Xth-tier resistor where X=1, and the Xth tier including at least two Xth-tier resistors for each value of X in the range 2≤X≤T, wherein, for each value of X in the range 1≤X<T: each Xth-tier resistor is connected between a pair of nodes of the voltage-divider circuit at which a relatively high and low voltage signal are provided, respectively; at least one Xth-tier resistor is implemented as a subdivision network of discrete resistors; and for each Xth-tier resistor implemented as a subdivision network, that subdivision network includes a main resistor connected in series with a corresponding auxiliary resistor, that main resistor implemented as a base resistor connected in parallel with a series connection of a plurality of X+1th-tier resistors.

20 Claims, 9 Drawing Sheets

(51) Int. Cl.
*H03M 1/80* (2006.01)
*H03M 1/78* (2006.01)
*G01R 15/14* (2006.01)

(56) References Cited

U.S. PATENT DOCUMENTS

| | | |
|---|---|---|
| 9,654,136 B1 | 5/2017 | Deak |
| 2008/0100489 A1* | 5/2008 | Trifonov ............... H03M 1/682 341/145 |
| 2015/0194949 A1 | 7/2015 | McQuirk et al. |

FOREIGN PATENT DOCUMENTS

| | | |
|---|---|---|
| JP | S59-012612 A | 1/1984 |
| JP | 2002-252536 A | 9/2002 |
| JP | 2010-128315 A | 6/2010 |
| WO | 2017/195025 A2 | 11/2017 |

OTHER PUBLICATIONS

European Search Report issued in European Patent Application No. 18 21 5714, dated Jun. 18, 2019.

\* cited by examiner

VOLTAGE-DIVIDER CIRCUITS AND CIRCUITRY

CROSS-REFERENCE OF RELATED APPLICATIONS

This application claims the benefit of European Patent Application No. 18215714.9, filed on Dec. 21, 2018, the entire disclosure of which Applications is incorporated by reference herein.

The present invention relates to voltage-divider circuits and voltage-divider circuitry comprising one or more such voltage-divider circuits.

Voltage divider circuits (or voltage dividers) per se are well known in electronics as being passive circuits that are configured to provide an output voltage that is an intended fraction of an input voltage. The input voltage is distributed across components of the divider, leading to the concept of voltage division. For example, a voltage divider may comprise two resistors connected in series, with the input voltage applied across the series-connected resistor pair and the output voltage being produced across one of those resistors.

For simplicity, voltages in respect of such a voltage divider may be referred to as voltages at a given circuit node, this taken to mean a voltage level at that node relative to a given reference voltage (such as ground). In the above example voltage divider comprising two resistors connected in series, the series connection may be considered to be between ground and the input voltage, with the output voltage being produced or "tapped" from the connection (i.e. node) between the resistors.

Resistor voltage dividers are commonly used to create reference voltages (other uses include reducing the magnitude of a voltage so it can be measured and signal attenuation at low frequencies). For DC and relatively low frequencies, a voltage divider may be sufficiently accurate if made only of resistors. Where frequency response over a wide frequency range is required (such as in mixed-signal circuitry, e.g. digital-to-analogue and analogue-to-digital converters), a voltage divider may have capacitive elements added.

By way of example, FIG. 1 presents a schematic diagram of a previously-considered voltage-divider circuit 1A (ignore circuits 1B and 1C for now). The voltage-divider circuit 1A comprises N resistors, $R_1$ to $R_N$, connected together in series to form a linear resistor ladder. The voltage-divider circuit 1A is shown in FIG. 1 in reduced form so that not all N resistors are explicitly shown. It will be understood that a given resistor $R_i$ of the N resistors, $R_1$ to $R_N$, where $1 \leq i \leq N$ has resistance Ri, for simplicity. That is, the notation Ri serves both to label the resistor and represent its resistance.

One of the N resistors 10 is explicitly labelled $R_i$ in FIG. 1, simply as an example useful for understanding aspects of the present invention later herein. Although the resistor 10 is shown as being any one of the N resistors between $R_2$ and $R_N$, it will be understood later herein that considerations which apply to resistor 10 could apply to any of the N resistors so that it could be considered representative of any of resistors $R_1$ to $R_N$.

The series connection of the N resistors is between nodes $n_0$ and $n_N$, which are the end nodes of a series of nodes $n_0$ to $n_N$. Intermediate nodes $n_1$ to $n_{N-1}$ of the series are defined between adjacent resistors. For example, node $n_1$ is defined between resistors $R_1$ and $R_2$, node $n_2$ is defined between resistors $R_2$ and $R_3$, and node $n_i$ of the series of nodes $n_0$ to $n_N$ is defined between resistors $R_i$ and $R_{i+1}$ (for $1 \leq i < N$). Again, merely as an example, the nodes either side of resistor 10 are explicitly labelled as $n_{i-1}$ and $n_i$ in FIG. 1.

It is assumed here for simplicity that all of the N resistors have the same unit resistance R, such that $R=R_1=R_2=R_3$ and so on and so forth. Thus, as indicated in FIG. 1, an input voltage $V_0$ applied between nodes $n_0$ and $n_N$ produces output voltages $V_0/N$ across each of the N resistors. Put another way, and assuming that node $n_N$ is biased to ground (GND), then an input voltage $V_0$ applied at node $n_0$ produces an output voltage $V_0/N$ at node $n_{N-1}$, an output voltage $2V_0/N$ at node $n_{N-2}$, and so on and so forth. The voltage $V_0/N$ across a single unit resistor of this voltage ladder configuration may be referred to as a voltage tap step, and is equal across each resistor because they have the same unit resistance R.

Continuing the assumption that all of the N resistors have the same resistance, a drawback of the voltage-divider circuit 1A is that to increase the output resolution by a factor M the number of resistors employed needs to be increased by a factor M. For example, for the voltage across each resistor to be $V_0/N/M$, where $M \geq 2$, the number of resistors N would need to be increased by a factor of M such that there are M*N resistors (if N=M, the number of resistors would have been squared).

By way of example, FIG. 3 presents a schematic diagram of a previously-considered voltage-divider circuit 3A (ignore the circuit 3B for now), corresponding to the voltage-divider circuit 1A but expanded to comprise M*N resistors.

The voltage-divider circuit 3A comprises M*N resistors, $R_1$ to $R_{N*M}$, connected in series between nodes $n_0$ and $n_{M*N}$, for consistency with voltage-divider circuit 1A of FIG. 1. Again, it will be understood that a given resistor $R_i$, where $1 \leq i \leq N*M$, has resistance $R_i$. For simplicity, it is assumed that the resistors $R_1$ to $R_{N*M}$ have the same unit resistance as one another, being the unit resistance R, and that the input voltage $V_0$ is applied at node $n_0$. Further, the voltage-divider circuit 3A is shown in FIG. 3 in reduced form so that not all M*N resistors are explicitly shown.

Thus, in FIG. 3, an input voltage $V_0$ applied between nodes $n_0$ and $n_{M*N}$ produces the desired output voltages $V_0/N/M$ across each of the M*N resistors (equidistant voltage steps). Assuming that node $n_{N*M}$ is biased to ground (GND), then an input voltage $V_0$ applied at node $n_0$ produces an output voltage $V_0/N/M$ at node $n_{M*N-1}$, an output voltage $2V_0/N/M$ at node $n_{M*N-2}$, and so on and so forth.

The M*N resistors of the voltage-divider circuit 3A are shown in FIG. 3 as each falling within one of Groups 1 to 3. The Group 2 resistors are a group of M resistors (for convenience, denoted $R_i$ to $R_{i+M}$) which replace one of the resistors of the voltage-divider circuit 1A to form the voltage-divider circuit 3A. Each of the other resistors of the voltage-divider circuit 1A is also effectively replaced with M resistors to form the voltage-divider circuit 3A, those resistors falling into Group 1 or Group 3 depending on where in the voltage-divider circuit 3A they exist. Thus, the Group 2 resistors are a group of M resistors which replace one of the resistors of the voltage-divider circuit 1A other than resistors $R_1$ and $R_N$ to form the voltage-divider circuit 3A. Again, for ease of understanding of aspects of the present invention later herein, it can be assumed that the Group 2 resistors of the voltage-divider circuit 3A correspond to resistor 10 of voltage-divider circuit 1A.

Looking at the notation for the voltage-divider circuit 3A in FIG. 3, Group 1 comprises a linear string with i−1 elements (resistors) connected at input node $n_0$ (so, if i only increases to 1 in this Group it has no elements). Group 2 comprises a linear string with M elements at its input node (the node at the juncture between Group 1 and Group 2). Group 3 comprises a linear string with M*N−i−M=M*(N−1)−i elements connected at node $n_{M*N}$ (so, if i=M*(N−1) this group has no elements). Together, Groups 1 to 3 have N*M elements.

It can thus be more readily appreciated that in Group 2 of FIG. 3 output voltages $V_O/N/M$ are produced across each of the resistors of the voltage-divider circuit 3A, with an output voltage $V_O/N$ produced across the series connection of M resistors which make up Group 2.

A disadvantage of requiring so many more resistors (M*N compared to N) to increase the resolution (decrease the voltage step size) of the output voltages by a factor M has implications as concerned circuit area required, and thus also cost, for example in the case of integrated circuitry (e.g. provided on an IC chip).

For example, additional die area would be required for the additional resistors to achieve this factor M increase in resolution, leading to a high number of elements (resistors), high total die size and high layout and production costs. This may lead to a complex resistor network for non-integer divider voltage steps, especially, if multiple lateral voltage taps are implemented along the same resistor ladder. It may also be that re-adjustments (each calibration using a resistor bank) become necessary in practice. Further, if the resistor size is decreased to try to save on die area, resistor matching precision will be reduced, especially if the resistor area is reduced significantly. Multiple voltage taps along the same resistor ladder or re-adjustment may then also become more complex.

It is desirable to address the above problems.

According to an embodiment of a first aspect of the present invention there is provided a voltage-divider circuit, comprising: a network of discrete resistors connected (connectable or configured to be connected, conductively) together to define T tiers of resistors, where T≥2, the T tiers comprising first and subsequent tiers, each subsequent tier nested within the preceding tier, the Xth tier comprising at least one Xth-tier resistor where X=1, and the Xth tier comprising at least two Xth-tier resistors for each value of X in the range 2≤X≤T, wherein, for each value of X in the range 1≤X<T: each Xth-tier resistor is connected between a pair of nodes of the voltage-divider circuit at which a relatively high voltage signal and a relatively low voltage signal are provided, respectively; at least one Xth-tier resistor is implemented as a subdivision network of discrete resistors; and for each Xth-tier resistor implemented as a subdivision network, that subdivision network comprises a main resistor connected in series with a corresponding auxiliary resistor, that main resistor implemented as a base resistor connected in parallel with a series connection of a plurality of X+1th-tier resistors.

With such a voltage-divider circuit, it may be possible to provide a high-precision (high resolution) voltage output at a node between adjacent series-connected X+1th-tier resistors in an area-efficient (e.g. in terms of the number of resistors, and the geometrical size of such resistors) and design-efficient manner. For example, where the nodes between adjacent first-tier resistors give output voltages which fall either side of a desired output voltage, a said subdivision network may be used to implement one of those first-tier resistors to provide further nodes one of which does give the desired output voltage.

For each subdivision network, the base resistor may be connected between a pair of nodes of the voltage-divider circuit along a base current path, and the X+1th-tier resistors of that subdivision network may be connected in series between that pair of nodes along a series-connection current path, those current paths being independent of one another between the first and second nodes. That is, the series connection of a plurality of X+1th-tier resistors may be independent of the base resistor except at the ends of that series connection.

The first tier may comprise at least two first-tier resistors. The first-tier resistors may be connected in series between a pair of nodes of the voltage-divider circuit at which a relatively high voltage signal and a relatively low voltage signal are provided, respectively.

For at least one value of X in the range 1≤X<T, at least two of the Xth-tier resistors may be implemented as a subdivision network. That is, in any one tier at least two of the resistors may be implemented as a subdivision network. This enables such high-precision voltage outputs to be provided at multiple nodes in different regions of the voltage-divider circuit.

It may be that T≥3, i.e. there may be at least three resistor tiers. For each value of X in the range 1<X≤T, at least a plurality of the Xth-tier resistors may be part of a subdivision network which implements one of the X-1th-tier resistors. That is at least one subdivision network may be nested within (or implement one of the resistors of) another subdivision network. With each additional tier provided in this way, ever higher precision voltage outputs may be provided.

For at least one (up to each) said subdivision network, its series connection of resistors may comprise S of those resistors and the auxiliary resistor may be implemented as M resistors connected together in parallel. In such case, it may be that M≥2 and S≥2. The values of M and/or S may be different from subdivision network to subdivision network. The values of M and/or S may be the same from subdivision network to subdivision network.

It may be that, for the at least one (up to each) subdivision network, the S resistors of its series connection of resistors all have the same resistance value; the M resistors which implement its auxiliary resistor all have the same resistance value; the S resistors of its series connection of resistors and the M resistors which implement its auxiliary resistor all have the same resistance value; or the base resistor, the S resistors of its series connection of resistors and the M resistors which implement its auxiliary resistor all have the same resistance value. Having the same resistance value may lead to ease of design, good matching and high precision.

The voltage-divider circuit may be implemented at board level, for example on a PCB (printed circuit board). The voltage-divider circuit may be implemented at package level, for example on a substrate of an IC chip package.

The voltage-divider circuit may be implemented as integrated circuitry, for example on an IC chip. For the at least one (up to each) subdivision network, each of the discrete resistors may be a polysilicon or diffusion or other planar resistor. It may be that, for the at least one (up to each) subdivision network, the base resistor, the S resistors of its series connection of resistors and the M resistors which implement its auxiliary resistor all have the same width and length as one another; the base resistor and the S resistors of its series connection of resistors have relatively large widths and lengths, and the M resistors which implement its auxiliary resistor have relatively small widths and lengths; the base resistor has a relatively large width and length, and the S resistors of its series connection of resistors and the M resistors which implement its auxiliary resistor have relatively small widths and lengths; or the base resistor has a relatively large width and length, the S resistors of its series connection of resistors have medium widths and lengths, and the M resistors which implement its auxiliary resistor have relatively small widths and lengths. Having the same widths and lengths may lead to ease of design, good matching and high precision. Having reduced widths and lengths may lead to more area-efficient (and thus cost-efficient) design.

For the at least one (up to each) said subdivision network it may be that M≥3 and M=S+1. For the at least one (up to each) said subdivision network it may be, additionally or alternatively, that the resistor implemented by that subdivision network has a resistance R, its auxiliary resistor has the resistance R/M, its base resistor has the resistance R and its series connection of S resistors has the resistance R*S.

For the at least one (up to each) said subdivision network, the base resistor may have the same resistance value as the resistance value of the resistor which that subdivision network implements. Thus, each subdivision network effectively replaces (in terms of design) the resistor which it implements without affecting the voltages at other nodes.

Some or all of said discrete resistors may have the same resistance value as one another. The voltage-divider circuit may be implemented as integrated circuitry. Each of the discrete resistors may be a polysilicon or diffusion or other planar resistor. Some or all of the discrete resistors may have the same widths and lengths as one another. Having the same resistance value may lead to ease of design, good matching and high precision. Having the same widths and lengths may lead to ease of design, good matching and high precision.

For one, some or all of the discrete resistors of the voltage-divider circuit, each of those discrete resistors may be part of a respective or corresponding discrete impedance or be connected in parallel with a corresponding capacitor.

The variables T, M, N, S and X may be positive integers.

According to an embodiment of a second aspect of the present invention there is provided voltage-divider circuitry, comprising at least two voltage-divider circuits according to the aforementioned first aspect of the present invention connected together.

According to an embodiment of a third aspect of the present invention there is provided voltage regulation circuitry, comprising a voltage-divider circuit according to the aforementioned first aspect of the present invention.

According to an embodiment of a fourth aspect of the present invention there is provided analogue-to-digital circuitry or digital-to-analogue circuitry, comprising a voltage-divider circuit according to the aforementioned first aspect of the present invention, or voltage-divider circuitry according to the aforementioned second aspect of the present invention, or voltage regulation circuitry according to the aforementioned third aspect of the present invention.

According to an embodiment of a fifth aspect of the present invention there is provided integrated circuitry comprising a voltage-divider circuit according to the aforementioned first aspect of the present invention, or voltage-divider circuitry according to the aforementioned second aspect of the present invention, or voltage regulation circuitry according to the aforementioned third aspect of the present invention, or analogue-to-digital circuitry or digital-to-analogue circuitry according to the aforementioned fourth aspect of the present invention.

Reference will now be made, by way of example, to the accompanying drawings, of which:

In order to allow ready comparison between embodiments of the present invention and the voltage-divider circuits 1A and 3A described above, the general aim to increase the voltage resolution provided by voltage-divider circuit 1A of $V_0/N$ to $V_0/N//M$ as provided by voltage-divider circuit 3A will be carried forwards. However, it will be appreciated that this is simply a convenient example useful for better understanding the present invention and its advantages.

By way of introduction, an overarching consideration behind the disclosed embodiments is that the desired resolution $V_0/N//M$ might not be required across the whole of a voltage-divider circuit in any given application. For example, looking at the voltage-divider circuit 1A of FIG. 1, it may be that the resolution $V_0/N//M$ is only required within the voltage step $V_0/N$ across the resistor 10 explicitly labelled $R_i$ (and this will be assumed here as a running example).

Figure 1:
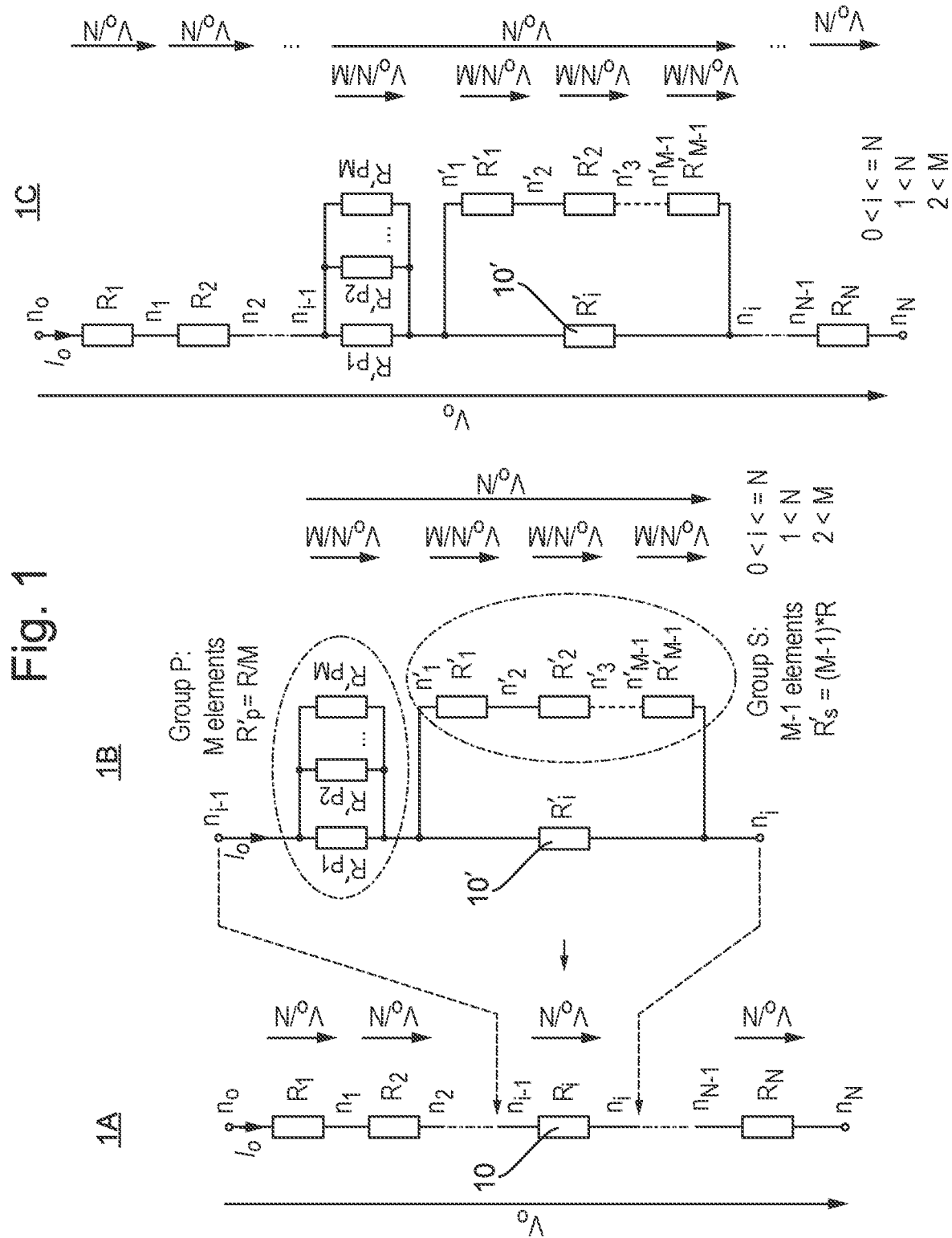
FIG. 1 is a schematic diagram of a previously-considered voltage-divider circuit alongside voltage-divider circuits embodying the present invention.

Circuits 1B and 1C of FIG. 1 embody the present invention, and are to be considered in relation to voltage-divider circuit 1A. The aim is to extend the given linear resistor ladder (voltage-divider circuit 1A) with N base resistors having unit resistance R by substitution of a subdivision network of resistors (a new local circuit) for a given one of the N resistors (in this example, resistor 10).

Circuit 1B is such a subdivision (or expansion) network 1B of resistors, shown schematically. The subdivision network 1B, as above, is intended to be substituted for a given one of the N resistors, here the resistor 10 explicitly denoted $R_i$, of the voltage-divider circuit 1A of FIG. 1, as indicated. However, the subdivision network 1B could be substituted for any one of the N resistors of the voltage-divider circuit 1A. Before considering the subdivision network 1B in more detail, however, FIG. 2 will first be considered.

Figure 2:
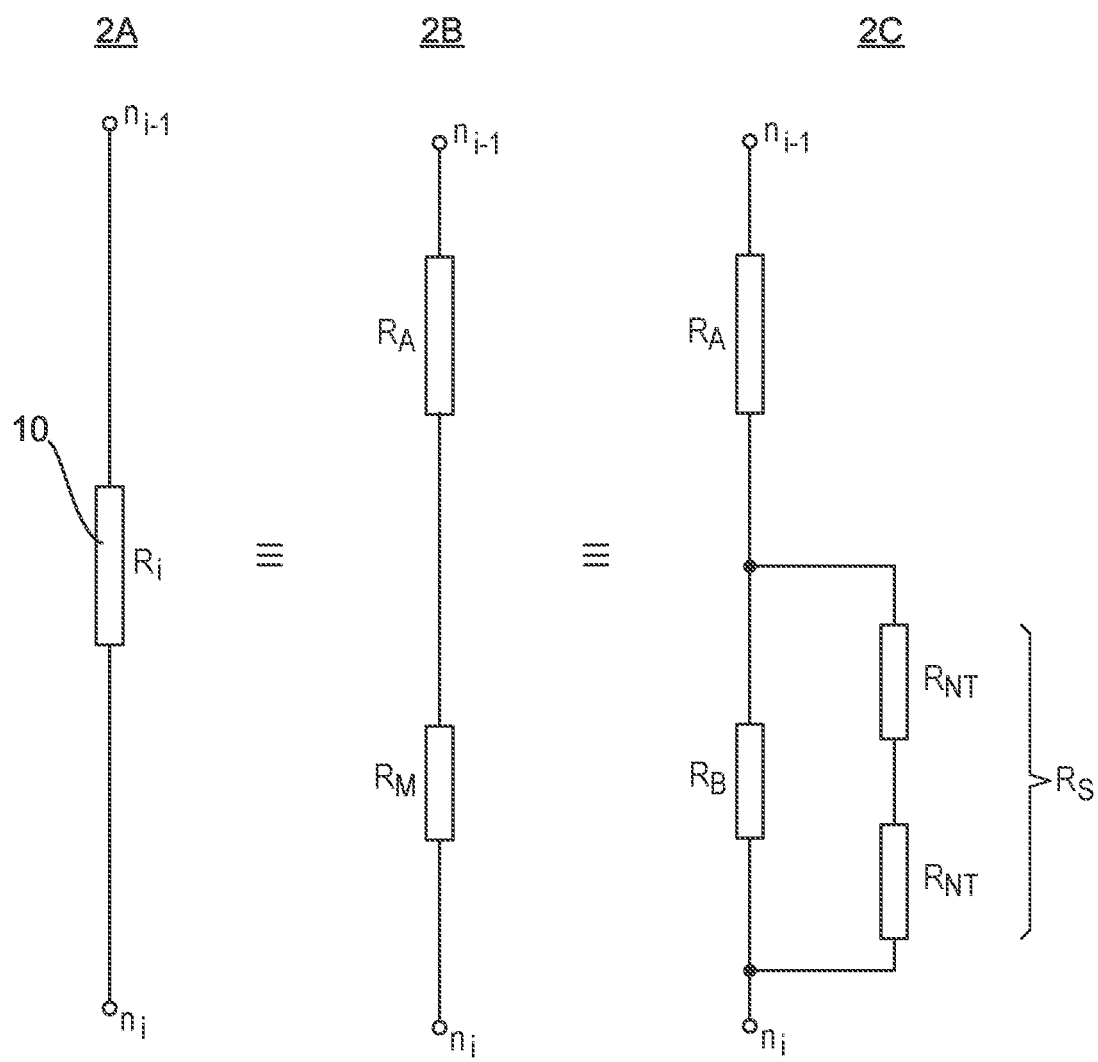
FIG. 2 is a schematic diagram of resistor networks useful for understanding the FIG. 1 embodiments.

FIG. 2 is a schematic diagram showing equivalent circuits 2A, 2B and 2C. The circuits 2A, 2B and 2C are indicated in FIG. 2 as being equivalent to one another in that they have the same overall resistance as one another.

The circuit 2A comprises the single resistor 10 in the voltage-divider circuit 1A, connected between corresponding explicitly-labelled nodes $n_{i-1}$ and $n_i$. The circuit 2A is thus effectively a portion of the voltage-divider circuit 1A corresponding to resistor 10 (but could be taken to correspond to any of the resistors $R_1$ to $R_N$).

The circuit 2B comprises a main resistor $R_M$ connected in series with a corresponding auxiliary resistor $R_A$. The circuit 2B is equivalent to the circuit 2A in that it has the same overall resistance, thus with $R_i=R_A+R_M$, and could be substituted for the single resistor 10 in the voltage-divider circuit 1A (or any of the N resistors $R_1$ to $R_N$) without affecting the voltage division provided at the nodes no to $n_N$.

The circuit 2C is the same as the circuit 2B, except that the main resistor $R_M$ is implemented as a base resistor $R_B$ connected in parallel with a series connection of a plurality of next-tier resistors $R_{NT}$. The series connection of next-tier resistors $R_{NT}$ may be considered to have a combined resistance $R_S$ as indicated. The circuit 2C is equivalent to the circuits 2A and 2B in that it has the same overall resistance and could be substituted for the single resistor 10 (or any of the N resistors $R_1$ to $R_N$) in the voltage-divider circuit 1A without affecting the voltage division provided at the nodes $n_0$ to $n_N$.

At this juncture, the notion of "tiers" will be explained. In the context of the voltage-divider circuit 1A the N resistors may be considered a first tier of resistors, indicating that a first level of output voltage resolution is provided over each of the N resistors, being $V_0/N$ as mentioned above. If the circuit 2C is substituted for the resistor 10 in the voltage-divider circuit 1A then a second (higher) level of output voltage resolution is provided over each of the next-tier resistors $R_{NT}$, i.e. with a voltage over each of the next-tier resistors $R_{NT}$ being less than $V_0/N$. The next-tier resistors $R_{NT}$ in the circuit 2C effectively form a further tier of resistors, in this case a second tier (giving the second level of output voltage resolution) given that the resistor being replaced is a first-tier resistor.

The notion of tiers herein will be understood accordingly. For example, if a further circuit 2C were itself to be substituted for one of the second-tier resistors (effectively nesting circuits 2C within one another) then a third (higher) level of output voltage resolution may be provided over each of the further next-tier resistors $R_{NT}$ in that case. In this regard, the further next-tier resistors $R_{NT}$ in the further circuit 2C form a third tier (giving a third level of output voltage resolution) given that the resistor being replaced in this case is a second-tier resistor.

Returning to FIG. 1, the subdivision network 1B is schematically equivalent to the circuit 2C, in that it effectively comprises a main resistor connected in series with a corresponding auxiliary resistor, that main resistor implemented as a base resistor connected in parallel with a series connection of a plurality of next-tier resistors. However, the subdivision network 1B is (for reasons that will become apparent) implemented out of discrete resistors which each have the same unit resistance R as each of the N resistors of the voltage-divider circuit 1A.

In detail, the auxiliary resistor of the subdivision network 1B is implemented as a parallel connection of M resistors denoted $R'_{P1}$ to $R'_{PM}$, which each have unit resistance R, so that $R=R'_{P1}=R'_{P2}$ and so on and so forth. This parallel connection of M resistors denoted $R'_{P1}$ to $R'_{PM}$ is referred to in FIG. 1 as a Group P of resistors. The base resistor of the subdivision network 1B is implemented as a single resistor 10' denoted R'i, which also has the unit resistance R. The series connection of a plurality of next-tier resistors in the subdivision network 1B is implemented as a series connection of M−1 resistors denoted $R'_1$ to $R'_{M-1}$, which each have unit resistance R, so that $R=R'_1=R'_2$ and so on and so forth. This series connection of M−1 resistors denoted $R'_1$ to $R'_{M-1}$ is referred to in FIG. 1 as a Group S of resistors.

It could thus be considered that the Group S of resistors comprises a series connection of S resistors where M=S+1. However, other arrangements of the subdivision network 1B are envisaged where M and S are independent integer variables, for example simply with M≥2 and S≥2. For ease of understanding, however, the relationship M=S+1 will be followed here for consistency.

The Group P parallel connection of M resistors has an overall resistance of $R'_P=R/M$ and the Group S series connection of M−1 resistors has an overall resistance of $R'_S=(M-1)*R$, as indicated in FIG. 1. Thus, assuming that the subdivision network 1B is substituted for the resistor 10 explicitly labelled $R_i$ in the voltage-divider circuit 1A, then the output voltage across the Group P parallel connection of M resistors is $V_0/N/M$ and the output voltage across each resistor of the Group S series connection of M−1 resistors is also $V_0/N/M$, as indicated in FIG. 1, giving the target output voltage resolution of $V_0/N/M$. This provides the target output voltage resolution of $V_0/N/M$ within the voltage step $V_0/N$ across the resistor 10 in line with the running example. Effectively, the subdivision network 1B creates a 'local' resistor path (series connection of M−1 resistors denoted $R'_1$ to $R'_{M-1}$) for relatively small voltage step values which runs parallel to the string of N resistors (one of which the subdivision network 1B is substituted for).

It is noted here that, with the resistors $R'_1$ to $R'_{M-1}$, $R'_{P1}$ to $R'_{PM}$ and $R'_i$ all having the unit resistance R, the overall resistance of the subdivision network 1B is equal to the unit resistance R. Thus, the subdivision network 1B is readily substituted for the resistor 10 in the voltage-divider circuit 1A, which also has the unit resistance R, without affecting the voltage division at other nodes. In this regard, circuit 1C is a voltage-divider circuit equivalent to the voltage-divider circuit 1A, shown schematically. Specifically, as compared to the voltage-divider circuit 1A, in the voltage-divider circuit 1C the subdivision network 1B has been substituted for the resistor 10 explicitly labelled $R_i$. Interestingly, the resistor 10' of the subdivision network 1B and thus also of the voltage-divider circuit 1C is effectively the same as the resistor 10 of the voltage-divider circuit 1A.

The voltage-divider circuit 1C has the same total resistance of N*R as the voltage-divider circuit 1A at R=R' and results in unchanged node voltages at unchanged circuit parts, if all unit resistors have the same resistance value R=R'. This equivalence between the voltage-divider circuits 1A and 1C is improved if the "new" resistors in the voltage-divider circuit 1C (as compared to 1A) are laid out narrowly (in terms of circuit layout) for good physical matching and good voltage precision (as commented on in more detail below).

The voltage-divider circuit 1C is a network of discrete resistors organised into or connected together to define T tiers of resistors, where T≥2, the T tiers comprising first and subsequent tiers, each subsequent tier nested within the preceding tier. In the case of the voltage-divider circuit 1C, there are two tiers, i.e. T=2. The first tier comprises the N resistors which correspond respectively to the N resistors of the voltage-divider circuit 1A, those resistors being referred to as first-tier resistors. Of course, one of those first-tier resistors (resistor 10 in the running example) is implemented as the subdivision network 1B. So the subdivision network 1B as provided in the voltage-divider circuit 1C is in effect nested within (or is equivalent to) the resistor 10. The second tier in the voltage-divider circuit 1C comprises the series connection of M−1 resistors denoted $R'_1$ to $R'_{M-1}$ taken from the subdivision network 1B, those resistors being referred to here as second-tier resistors. In this sense, the second tier is nested within the first tier.

The first tier may comprise at least one first-tier resistor. For example, the subdivision network 1B is equivalent to one of the first-tier resistors of the voltage-divider circuit 1A in the case of FIG. 1, but it could be that the other first-tier resistors are omitted in other arrangements. In effect, the subdivision network 1B could be considered a voltage-divider circuit in itself.

The or each subsequent tier after the first tier (i.e. the second and, if provided, third tier onwards) comprises at least two resistors comprising the series connection of M−1 resistors denoted $R'_1$ to $R'_{M-1}$ of the corresponding subdivision network 1B creating the tier concerned. Thus, effectively, in the case of the subdivision network 1B, M>2. For each tier other than the last one, at least one of the preceding-tier resistors is implemented as a subdivision network of discrete resistors (for example as a subdivision network 1B). In the case of the voltage-divider circuit 1C, where T=2, at least one of the first-tier resistors is implemented as a subdivision network 1B.

Assuming that the output voltage resolution $V_O/N/M$ is only needed where indicated in the voltage-divider circuit 1C, i.e. in place of the resistor 10 as in the running example, then one advantage associated with the voltage-divider circuit 1C as compared to the voltage-divider circuit 3A is that fewer resistors are required where N>1 and M>2. In some arrangements it may be that N≥4 and M≥8. For example, whereas the voltage-divider circuit 1A has N unit resistors (elements) and the voltage-divider circuit 3A has N*M unit resistors, the voltage-divider circuit 1C has N+(2*M)−1 unit resistors. This is because one of the N resistors in the voltage-divider circuit 1A has effectively been replaced with the 2*M resistors of the subdivision network 1B to arrive at the voltage-divider circuit 3A.

Figure 3:
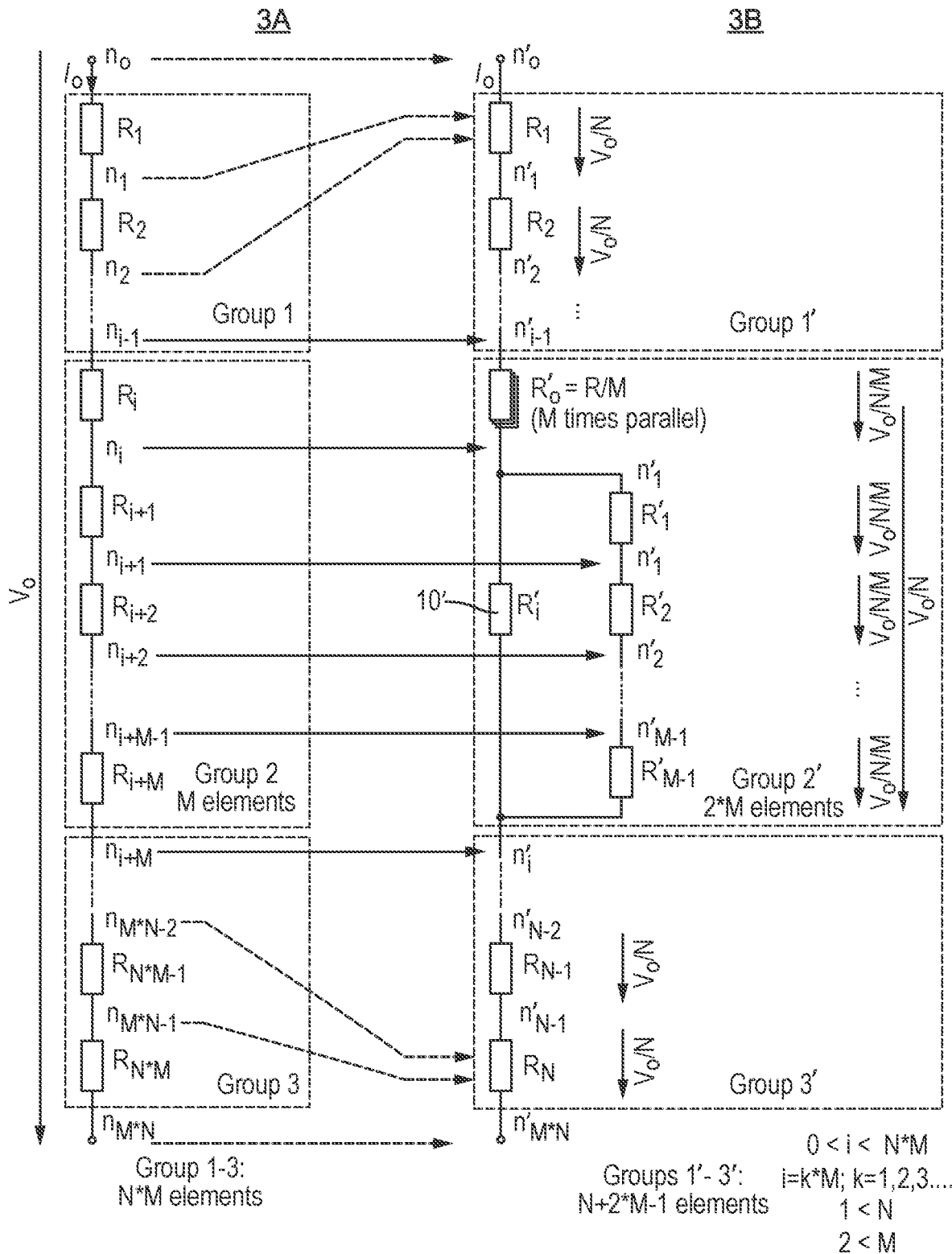
FIG. 3 is a schematic diagram of a previously-considered voltage-divider circuit alongside a voltage-divider circuit embodying the present invention.

Circuit 3B of FIG. 3 is voltage-divider circuit, shown schematically, which is the same as the voltage-divider circuit 1C. The voltage-divider circuit 3B has been drawn alongside the voltage-divider circuit 3A to allow a ready comparison between them, for example so that the ability of the subdivision network 1B to provide the second tier resistors $R'_1$ to $R'_{M-1}$ with output voltage resolution $V_O/N/M$ is apparent, as is the difference in the number of unit resistors between the two voltage-divider circuits (N*M vs N+(2*M)−1). It is apparent that the subdivision network 1B is scalable (i.e. the value M is a variable) and is a reusable resistor ladder sub-mesh.

It is noted here that the advantage stemming from a reduced number of resistors is dependent on the values of N and M and the number of resistors of the base voltage-divider circuit 1A over whose voltage step $V_O/N$ the output voltage resolution of $V_O/N/M$ is to be achieved. As above, in terms of the voltage-divider circuit 3A, each resistor of the voltage-divider circuit 1A is replaced with M resistors (hence M*N resistors in total). In terms of the voltage-divider circuit 3B, each resistor of the voltage-divider circuit 1A which is implemented as a subdivision network 1B is replaced with 2*M resistors (hence N+1(2*M)−1 resistors in total for one subdivision network 1B, N+2(2*M)−2 for two subdivision networks 1B, as so on and so forth). Of course, the value of M may be different from one subdivision network 1B to the next, but for the sake of argument M is assumed to have the same value here for each subdivision network 1B. That is, each subdivision network 1B adds 2*M−1 resistors as compared to the resistor it replaces. Thus, for a reduced number of resistors it may be desirable to set (N−r+2rM)/NM<1, where r is the number of resistors of the voltage-divider circuit 1A implemented as a subdivision network 1B.

Put another way, the saved area SA could be calculated as SA=NM−(N+2rM−r). The proportional saving SA/NM could then be calculated as SA/NM=1−1/M−2rN+r/NM to give a value between 0 and 1. If N and M have high values and NM>>1, then this could be approximated to SA/NM=1−1/M−2r/N. For high r the proportional saving SA/NM will still be high for r<<N.

Other advantages associated with the subdivision network 1B include accuracy and ease of design. Effectively, M times smaller local voltage steps sizes $V_O/N/M$ are achieved with significantly reduced implementation effort and die area at similar overall precision.

These advantages arise at least in part because all of the resistors of the subdivision network 1B have the unit resistance R as mentioned above, and thus can be configured in the same way as one another (and as each of the resistors of the voltage-divider circuit 1A). That is, all of the resistors of the voltage-divider circuit 1C can be configured in the same way as one another (which is advantageous in terms of design ease and matching).

For example, in the case of integrated circuitry, the resistors of the voltage-divider circuit 1C can be implemented as polysilicon or diffusion resistors (or other planar resistors) having the same geometric size as one another (equal widths as one another, and also equal lengths as one another), leading to good matching.

Figure 4:
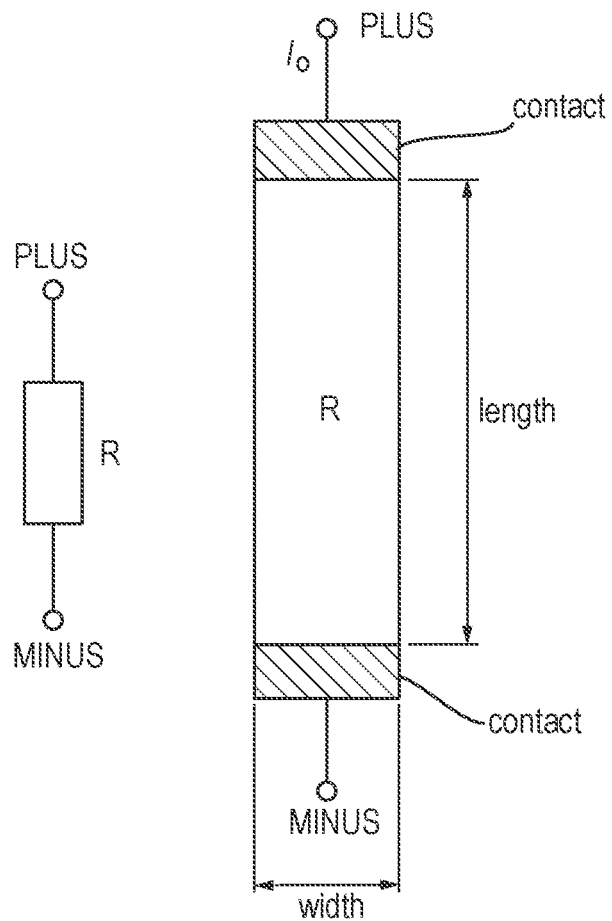
FIG. 4 is a schematic diagram of an example resistor for use in understanding its potential physical implementation (layout) in integrated circuitry.

FIG. 4 is a schematic diagram of an example resistor 20 for use in understanding its potential physical implementation (layout) in integrated circuitry. For example, resistor 20 may be considered representative of any of the resistors described herein or depicted in the other Figures. Resistor 20 is shown both as a schematic symbol (on the left-hand side) and effectively in plan layout view (on the right-hand side).

Resistor 20 is has two metal pins or contacts, PLUS and MINUS, which serve as its terminals. Resistor 20 is assumed to be produced in a lateral silicon process e.g. as polysilicon-resistor with length and width dimensions as described above. The resistance is proportional to length/width ratio. Multiple placement of equal elements (resistors) with same resistance value and size have good physical matching and will result in a minimum voltage precision error. Close (or narrow) placement of such resistors will also minimise tracking and allow for improved matching and good voltage precision.

It will be appreciated that one possibility, looking at the subdivision network 1B, is to reduce the lengths and widths (i.e. area) of the 2*M−1 resistors of Groups S and P, as compared to the tier 1 resistors of the voltage-divider circuit 1C, for example to save on die area. This can be done while maintaining the length/width ratio to keep the unit resistance R as described above. For example, the currents flowing in each of the resistors of Groups S and P will be lower than in the tier 1 resistors of the voltage-divider circuit 1C. The parallel-connected resistors of Group P will be less sensitive to resistance variance (in terms of accuracy/precision of the voltages in the voltage-divider circuit 1C) than the series-connected resistors of Group S. Thus, it may be possible to reduce the lengths and widths of the Group P resistors more than the group S resistors whilst keeping to an acceptable level of precision of the voltages in the voltage-divider circuit 1C.

Figure 5:
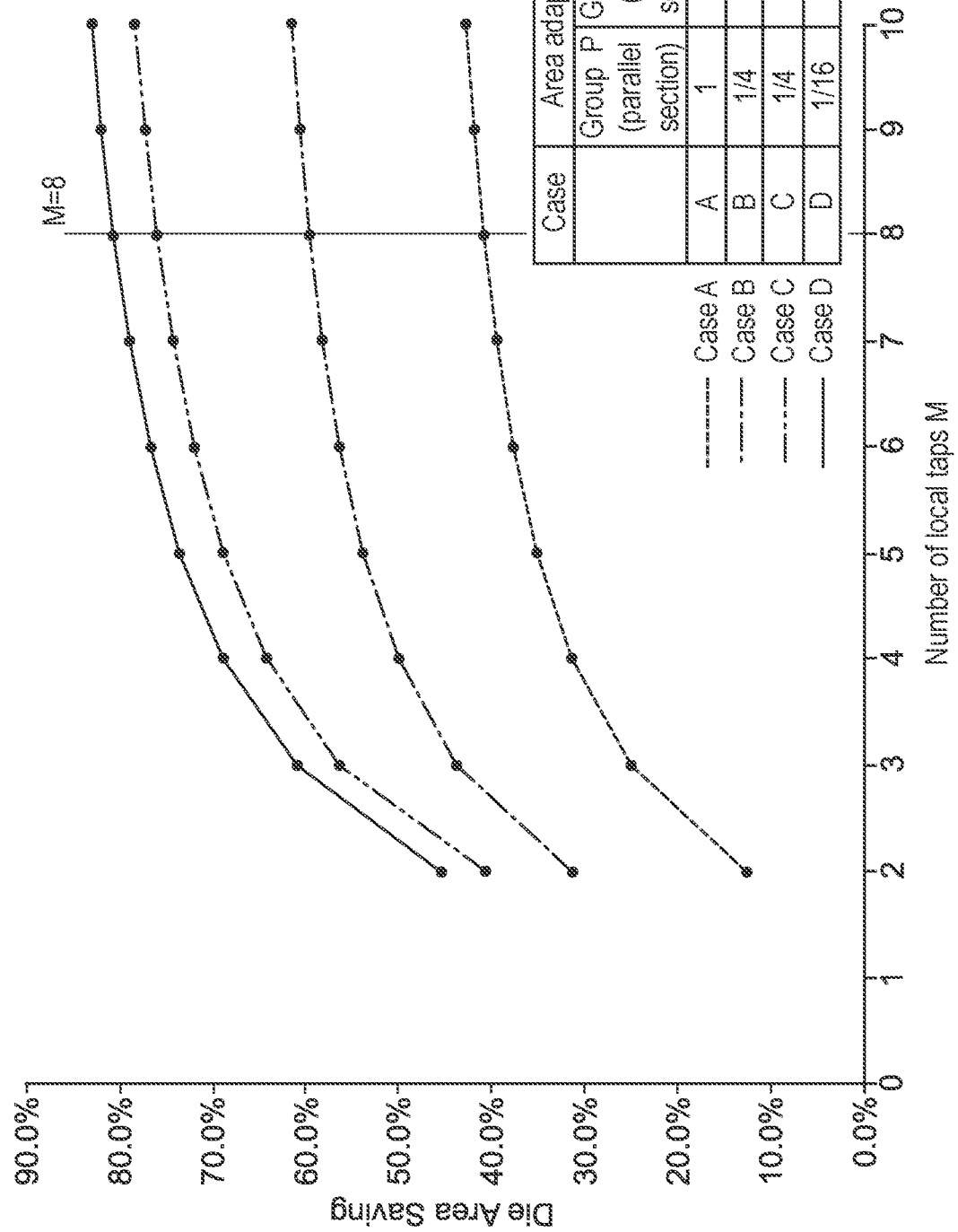
FIG. 5 is a graph of simulated performances to demonstrate the effect of varying resistor dimensions.

FIG. 5 is a graph of simulated performances to demonstrate the effect of varying the resistor dimensions in this way. Performance gain in terms of die size area saving is demonstrated at four configurations of the voltage-divider circuit 3B, configurations A to D, each relative to a base line case being the voltage-divider circuit 3A of FIG. 3 (being a ladder divider with N*M unit resistors with a constant voltage tap step of $V_O/N/M$). The X axis represents values of M and the Y axis represents percentage (%) die area saving.

Thus, a graph representing the voltage-divider circuit 3A would fall along the X axis itself (i.e. 0% die area saving).

The die size area saving function is calculated at N=4, and with varying values of M as shown up to M=10. In configuration A, all of the resistors of the voltage-divider circuit 3B have the same area, and thus the ratio of tier 1 resistors to Group P resistors to Group S resistors is 1:1:1, as indicated in the inset table. In configuration B, just the Group P resistors are reduced in area to give the corresponding ratio 1:1/4:1. In configuration C, the Group P and Group S resistors are reduced in area in the same way to give the corresponding ratio 1:1/4:1/4. In configuration D, the Group P resistors are reduced in area more than the Group S resistors to give the corresponding ratio 1:1/16:1/4. Focus is placed on the value M=8 in the following consideration of configurations A to D as an example.

In configuration A, at M=8, the number of additional base resistors caused by adding the subdivision network 1B is 2*M−1=15. If all resistors have the same geometrical size, this will end in total 4+2*M−1=19 base unit resistor elements in the voltage-divider circuit 3B, and requires 13 fewer resistors than the equivalent voltage-divider circuit 3A. This is an area saving of 40.625%.

In configuration B, the area size-adaptive idea is applied in Group P only. The structure of the voltage-divider circuit 3B concerned is otherwise as in configuration A. The parallel resistors of Group P are made 2 times smaller in width and two times smaller in length (to keep the unit resistance R). The total width for Group P is however equal or greater (at M≥2) than a first tier resistor. With same unit resistance constraint (R'=R), each of the resistors of Group P is thus 4 times reduced in die-area as compared to a first tier resistor. The area equivalent of added unit resistors is now calculated as M/4+M−1=9. This leads to 4+M/4+M−1=13 unit resistor area equivalents in total. This is an area saving of 59.4%.

In configuration C, the area size-adaptive idea (with a factor 4 reduction) is applied equally in Groups P and S. The structure of the voltage-divider circuit 3B concerned is otherwise as in configuration A. The area equivalent for added resistors is now calculated as (2*M−1)/4=3.75. This leads to 4+(2*M−1)/4=7.75 unit base resistor area equivalents in total. This is an area saving of 75.8%.

In configuration D, the area size-adaptive idea is applied in Groups P and S (but with factor 4 reduction in Group S and factor 16 reduction in Group P). The structure of the voltage-divider circuit 3B concerned is otherwise as in configuration A. The area equivalent for added resistors is now calculated as M/16+(M−1)/4=3.75. This leads to 4+M/16+(M−1)/4=6.25 unit resistor area equivalents in total. This is an area saving of 80.5%.

The area size-adaptive idea demonstrated in FIG. 5 enables the geometric size of added new unit resistors due to the subdivision network 1B to be reduced, but without influencing the overall precision error significantly. Resistance precision is for example proportion to sqrt(resistor area), and the reduction in area (and hence effect on precision) is applied in the FIG. 5 configurations in only some of the resistors.

The different relative area sizes could be summarised in terms of relative widths (with the lengths being sized for the appropriate resistance value R), assuming that in the voltage-divider circuit 3B all of the resistors other than in Groups P and S (see subdivision network 1B) have width w0, all of the resistors in Group S have width wS and all of the resistors in Group P have width wP. In configuration A, the width relationship is wP=wS=w0. In configuration B, the width relationship is wP<wS=w0. In configuration C, the width relationship is wP=wS<w0. In configuration D, the width relationship is wP<wS<w0.

Figure 6:
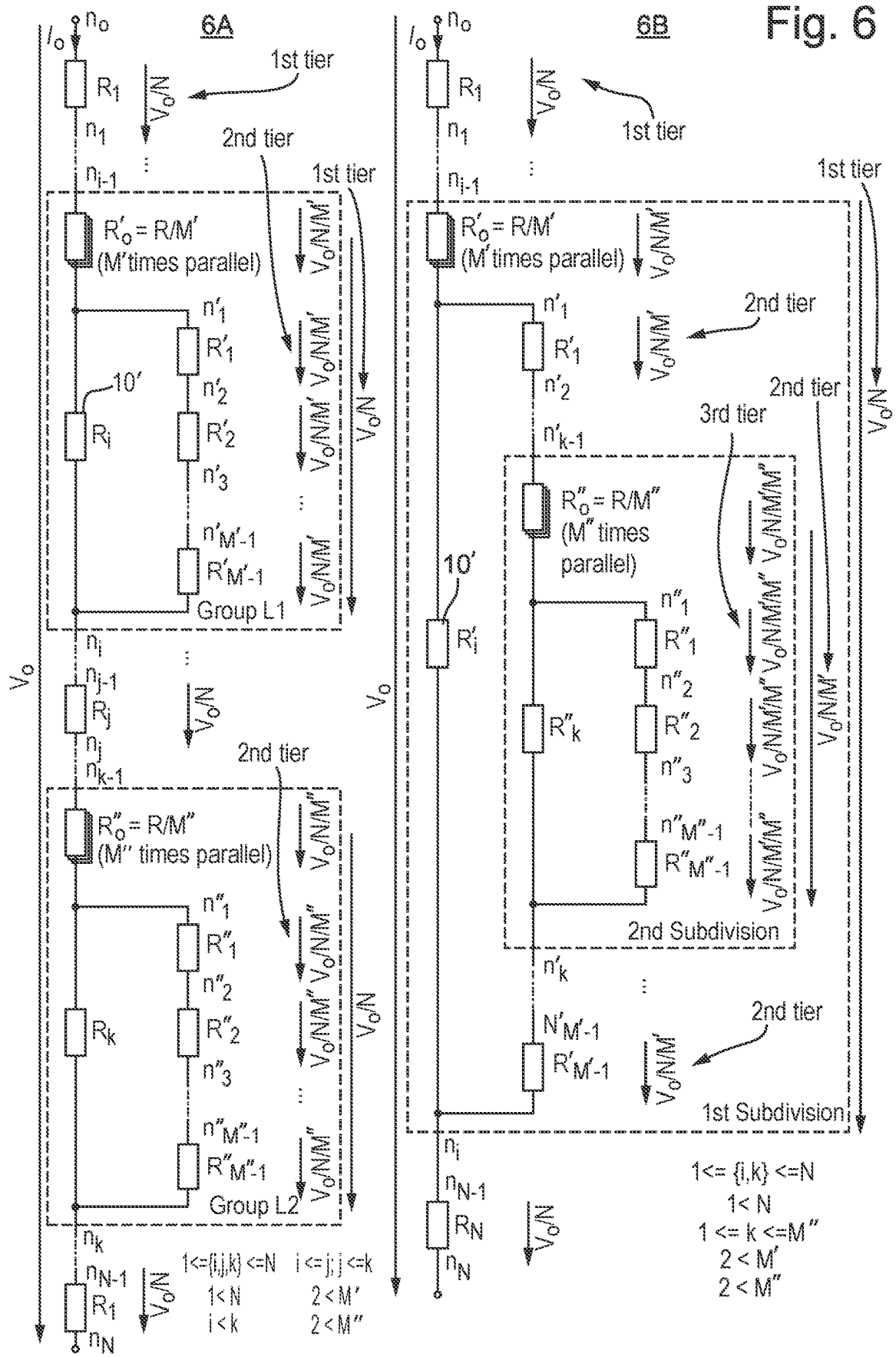
FIG. 6 is a schematic diagram of voltage-divider circuits embodying the present invention.

FIG. 6 is a schematic diagram of voltage-divider circuits 6A and 6B to demonstrate that the subdivision network 1B can be applied to the voltage-divider circuit 1A in a multi-lateral manner (voltage-divider circuit 6A) and in a multi-hierarchical manner (voltage-divider circuit 6B). Although the multi-lateral and multi-hierarchical ideas are thus shown separately, they can of course be used in combination.

Focusing first on the multi-lateral idea, the idea is to replace more than one unit base resistor of the voltage-divider circuit 1A with the subdivision network 1B to give multiple high resolution tap regions within a single resistor network. In the voltage-divider circuit 6A this has been done to create two such regions, with the two subdivision networks 1B regions being referred to as Groups L1 and L2. This is a highly efficient way of creating two such high resolution tap regions, without impacting other voltage tap outputs as compared to the voltage-divider circuit 1A in voltage shift or precision, and is highly area efficient.

In the voltage-divider circuit 6A, the Group L1 may be considered equivalent to the subdivision network 1B in the voltage-divider circuit 1C or 3B and is thus denoted in the same way except that the value M is denoted M' to distinguish it from the value M for the Group L1 which is accordingly denoted M".

It is thus assumed that the subdivision network 1B corresponding to Group L1 replaces an arbitrary resistor $R_j$ of the voltage-divider circuit 1A and that the subdivision network 1B corresponding to Group L2 replaces an arbitrary resistor $R_k$ of the voltage-divider circuit 1A, to arrive at the voltage-divider circuit 6A. Thus, there may be one, some or no resistors of the voltage-divider circuit 1A either side of the Groups L1 and L2.

The optionally different local voltage tap steps are thus $V_0/N/M'$ and $V_0/N/M"$, where M' and M" are independent parameters (M', M">2). An example of a first tier voltage step is labelled, as are two example second tier voltage steps (which could be different, e.g. if M' and M" are not equal).

Of course, the area size-adaptive idea described above may be applied in the voltage-divider circuit 6A. It may be considered that the number of additional unit resistors with optional smaller size is 2*(M'+M")−2. It may be considered that the number of unit resistors is N+2*(M'+M")−2.

Focusing second on the multi-hierarchical idea, the idea is to replace a unit base resistor R of the voltage-divider circuit 1A with a first subdivision network 1B (to give second tier resistors in the Group S), then replace one of the second tier Group S resistors of that subdivision network 1B with a further (second) subdivision network 1B (to give third tier resistors in the Group S), as so on and so forth.

This hierarchical recursion substitution is possible with more than two levels of subdivision (hence a multi-hierarchical idea). This is a very die area efficient (hence affecting layout and production costs) and systematic (hence affecting circuit regularity) way to achieve very small voltage steps.

In the voltage-divider circuit 6B, two levels of subdivision are shown by way of example. The first level is similar to that which arrives at the voltage-divider circuit 3B giving a local voltage tap step of $V_0/N/M'$ (where M is denoted M' to denote the first level of subdivision). One of the Group S resistors of this first level of subdivision is then replaced with a second subdivision network 1B giving a local voltage tap step of $V_0/N/M'/M"$ (where the second M is denoted M" to denote the second level of subdivision). Thus, M" times smaller voltage tap steps of $V_0/N/M'/M''$ are realised in the second level of subdivision, where M' and M' are independent parameters (M', M''>2).

The optionally different local voltage tap steps are thus $V_0/N/M'$ and $V_0/N/M'/M''$, where M' and M'' are independent parameters (M', M''>2). An example of a first tier voltage step is labelled, as are example second tier and third tier voltage steps.

Of course, the area size-adaptive idea described above may be applied in the voltage-divider circuit 6B. It may be considered that the number of additional unit resistors with optional smaller size is 2*(M'+M'')−2. It may be considered that the number of unit resistors is N+2*(M'+M'')−2.

It is thus assumed that the first subdivision network 1B replaces an arbitrary resistor of the voltage-divider circuit 3A. Thus, there may be one, some or no resistors of the voltage-divider circuit 3A on either side of the $1^{st}$ subdivision box indicated in respect of the voltage-divider circuit 6B.

Figure 7A:
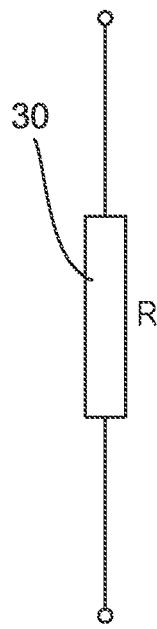
FIG. 7A is a schematic diagram of an example resistor and FIG. 7B is a schematic diagram of an impedance comprising the resistor of FIG. 7A.
Figure 7B:
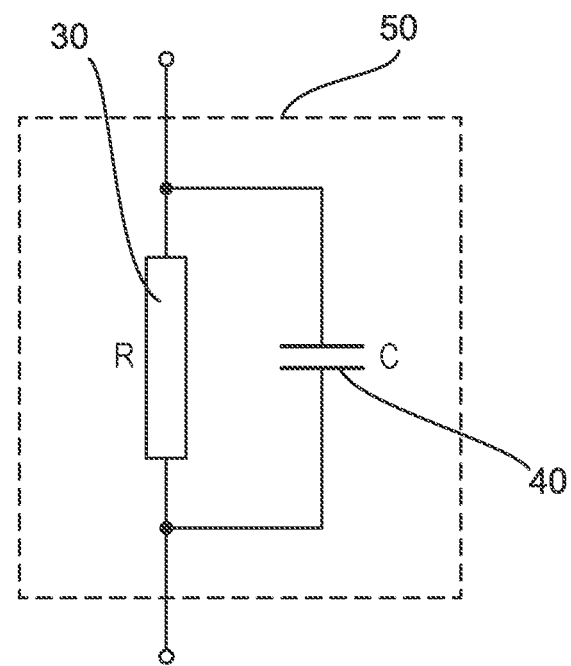

FIG. 7A is a schematic diagram of an example resistor 30 for comparative purposes. Resistor 30 may be considered representative of any of the resistors described herein or depicted in the other Figures. FIG. 7B is a schematic diagram of the example resistor 30 but provided with a capacitor 40 connected in parallel with it, to provide an RC combination 50. In any of the circuits described above, any or all of the resistors could be replaced with the RC combination (i.e. impedance) 50, for example where frequency response over a wide frequency range is required (such as in mixed-signal circuitry, e.g. digital-to-analogue and analogue-to-digital converters). The present disclosure will be understood accordingly.

Incidentally, in the description of e.g. the subdivision network 1B and voltage-divider circuits 1C, 3B, 6A and 6B emphasis has been placed on the resistors all having the unit resistance R with the benefits of inter alia precision and ease of layout in mind. However, it will be appreciated that such circuits could be provided in which the resistors do not all have the same resistance. Merely as an example, rather than providing M resistors in parallel in the Group P of the subdivision network 1B it would be possible to provide a single resistor having a resistance which is the same as that of the parallel-connection of the Group P resistors. Similarly, rather than providing M−1 resistors in series in the Group S of the subdivision network 1B it would be possible to provide a pair of series-connected resistors with resistances set to define a desired voltage level at the node between them. Other examples of course exist, such as the number of resistors in the Groups P and S of the subdivision network 1B not necessarily being M and M−1, respectively, but independent numbers X and Y, where X≥1 and Y≥2. This flexibility on resistance value and numbers of resistors also extends to resistors other than those of a subdivision network 1B.

In summary, an overall idea disclosed herein is to employ an efficient architecture (subdivision network 1B) which is easy to implement, re-usable, interchangeable and scalable. As above, each subdivision network 1B can be area optimized (in terms of die area, which affects cost), by making the size of the Group P and/or S resistors smaller than the base resistors to the extent possible without significant lost precision. As in FIG. 5, the configuration D can for example allow the overall die area to be reduced by over 80%. As in FIG. 6, the subdivision network 1B can be used more than once (at the same tier level) in a single resistor ladder circuit such as the voltage-divider circuit 6A to achieve more than one local small voltage tap region, without affecting other regions in absolute voltage or precision. Optimization is possible in terms of the number as size of the voltage steps in each of the local small voltage tap regions, and in terms of the area sizes of the added resistors (i.e. of the Groups P and S). As also in FIG. 6, the subdivision network 1B can be used more than once (at different tier levels) to provide a very high precision voltage divider such as the voltage-divider circuit 6B with very small voltage steps, with limited required design effort and with limited die area (e.g. numbers of resistors). A combination of the multi-lateral and multi-hierarchical ideas may be provided in a single resistor ladder network to provide multi-voltage tapping in terms of individual voltage step sizes, easy local adjusting options without affecting other voltage tap outputs, especially at very low voltage steps (multi-hierarchical idea), and/or different precision at each voltage tap. There are disclosed herein high precision, area-efficient matching resistive voltage dividers, with size-adaptive, multi-lateral and/or multi-hierarchical variants, with possibility of the addition of capacitors as in FIG. 7B.

It will be appreciated that the voltage-divider circuits of the present invention may find wide use in electronic circuits. For example, they may be applied in any analogue circuit which requires a high precision DC output voltage (or output voltage stable over frequency). Other examples include analogue circuits with adjustable outputs, e.g. amplifier based current-to-voltage converters, reference buffers or with gain adjustments in the feedback loop.

Figure 8:
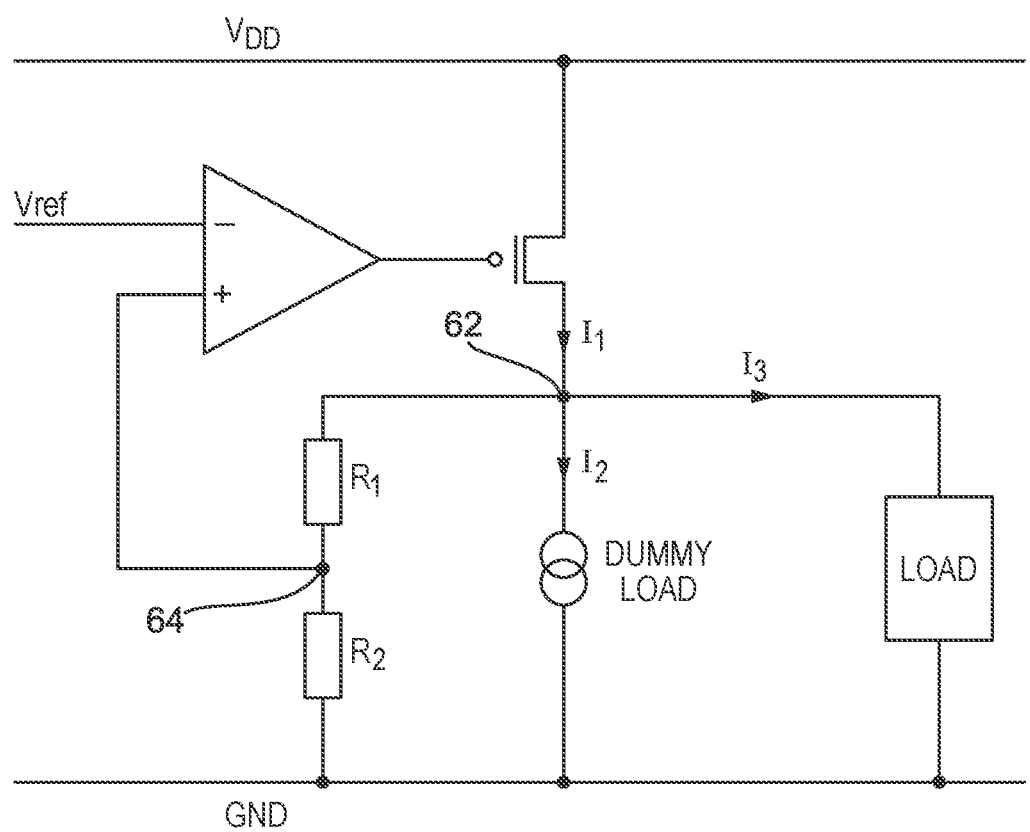
FIG. 8 is a schematic diagram of an analogue supply regulator circuit embodying the present invention.

One example use of a voltage-divider circuit according to the present invention is for example in an analogue supply regulator circuit. FIG. 8 is a schematic diagram of such an analogue supply regulator circuit (voltage regulation circuitry) 60. It will be appreciated that a voltage-divider circuit according to the present invention could be used to provide an accurate reference voltage Vref at the inverting input of the operational amplifier, and/or in place of the series connection of the resistors $R_1$ and $R_2$ to provide an accurate scaled version of the voltage at node 62 at the non-inverting input of the operational amplifier (i.e. controlling the voltage at node 64 based on an accurate ratio $R_1:R_2$). In this way, the relationship between currents $I_1$, $I_2$ and $I_3$ can be accurately controlled, to control the supply to the load. Such circuitry could be used in an ADC or a DAC.

Figure 9A:
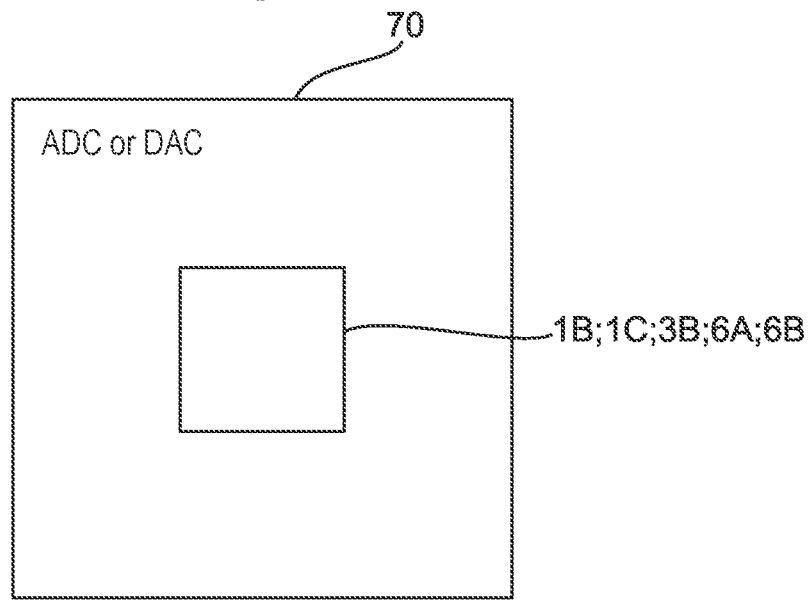
FIG. 9A is a schematic diagram of DAC or ADC circuitry embodying the present invention and FIG. 9B is a schematic diagram of integrated circuitry embodying the present invention.
Figure 9B:
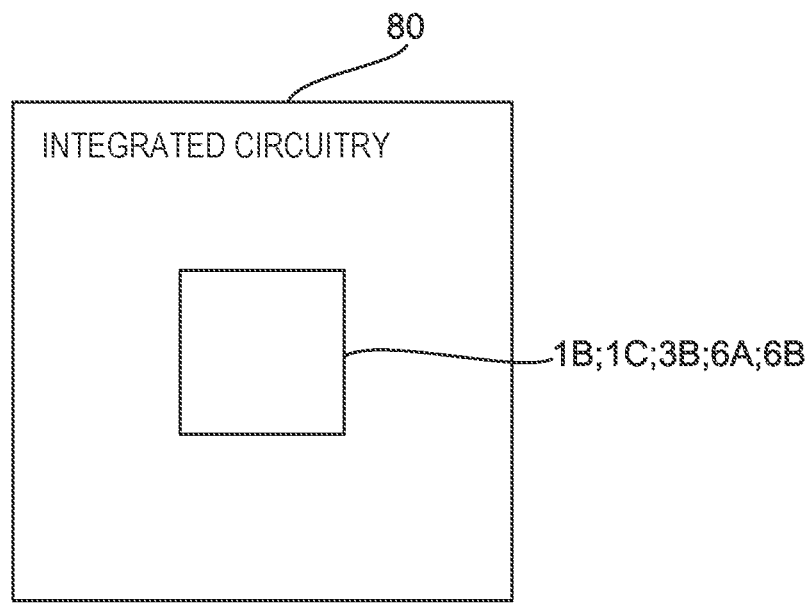

FIG. 9A is a schematic diagram of DAC or ADC circuitry 70 embodying the present invention. The DAC or ADC circuitry 70 comprises the subdivision network 1B or any of the voltage-divider circuits 1B, 1C, 3B, 6A, 6B described herein. The DAC or ADC circuitry 70 could be implemented as integrated circuitry, for example as or as part of an IC chip. FIG. 9B is a schematic diagram of integrated circuitry 80 embodying the present invention. The integrated circuitry 80 comprises the subdivision network 1B or any of the voltage-divider circuits 1B, 1C, 3B, 6A, 6B described herein. The integrated circuitry 80 could be or be part of an IC chip.

Circuitry of the present invention may be implemented as integrated circuitry, for example on an IC chip such as flip chip. Thus, the DAC or ADC circuitry 70 or integrated circuitry 80 may be an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A voltage-divider circuit, comprising:
a network of discrete resistors connected together to define T tiers of resistors, where T≥3, the T tiers comprising first and subsequent tiers, each subsequent tier nested within the preceding tier, the Xth tier comprising at least one Xth-tier resistor where X=1, and the Xth tier comprising at least two Xth-tier resistors for each value of X in the range 2≤X≤T,
wherein, for each value of X in the range 1≤X<T:
each Xth-tier resistor is connected between a pair of nodes of the voltage-divider circuit at which a relatively high voltage signal and a relatively low voltage signal are provided, respectively;
at least one Xth-tier resistor is implemented as a subdivision network of discrete resistors;
for each Xth-tier resistor implemented as a subdivision network, that subdivision network comprises a main resistor connected in series with a corresponding auxiliary resistor, that main resistor implemented as a base resistor connected in parallel with a series connection of a plurality of X+1th-tier resistors; and
for each value of X in the range 1<X≤T, at least a plurality of the Xth-tier resistors are part of said subdivision network which implements one of the X-1th-tier resistors.

2. The voltage-divider circuit as claimed in claim 1, wherein:
the first tier comprises at least two first-tier resistors; and
the first-tier resistors are connected in series between a pair of nodes of the voltage-divider circuit at which a relatively high voltage signal and a relatively low voltage signal are provided, respectively.

3. The voltage-divider circuit as claimed in claim 1, wherein for at least one value of X in the range 1≤X<T, at least two of the Xth-tier resistors are implemented as said subdivision network.

4. The voltage-divider circuit as claimed in claim 1, wherein, for at least one said subdivision network:
its series connection of resistors comprises S of those resistors;
the auxiliary resistor is implemented as M resistors connected together in parallel; and
M≥2 and S≥2.

5. The voltage-divider circuit as claimed in claim 4, wherein, for the at least one said subdivision network:
the S resistors of its series connection of resistors all have the same resistance value;
the M resistors which implement its auxiliary resistor all have the same resistance value;
the S resistors of its series connection of resistors and the M resistors which implement its auxiliary resistor all have the same resistance value; or
the base resistor, the S resistors of its series connection of resistors and the M resistors which implement its auxiliary resistor all have the same resistance value.

6. The voltage-divider circuit as claimed in claim 4, implemented as integrated circuitry, wherein, for the at least one said subdivision network, each of the discrete resistors is a polysilicon or diffusion or other planar resistor, and, for the at least one said subdivision network:
the base resistor, the S resistors of its series connection of resistors and the M resistors which implement its auxiliary resistor all have the same width and length as one another;
the base resistor and the S resistors of its series connection of resistors have relatively large widths and lengths, and the M resistors which implement its auxiliary resistor have relatively small widths and lengths;
the base resistor has a relatively large width and length, and the S resistors of its series connection of resistors and the M resistors which implement its auxiliary resistor have relatively small widths and lengths; or
the base resistor has a relatively large width and length, the S resistors of its series connection of resistors have medium widths and lengths, and the M resistors which implement its auxiliary resistor have relatively small widths and lengths.

7. The voltage-divider circuit as claimed in claim 4, wherein, for the at least one said subdivision network:
M≥3 and M=S+1; and/or
where the resistor implemented by that subdivision network has a resistance R, its auxiliary resistor has the resistance R/M, its base resistor has the resistance R and its series connection of S resistors has the resistance R*S.

8. The voltage-divider circuit as claimed in claim 4, wherein, for the at least one said subdivision network:
the base resistor has the same resistance value as the resistance value of the resistor which that subdivision network implements.

9. The voltage-divider circuit as claimed in claim 1, wherein:
some or all of said discrete resistors have the same resistance value as one another; and/or
the voltage-divider circuit is implemented as integrated circuitry, each of said discrete resistors is a polysilicon or diffusion or other planar resistor, and some or all of said discrete resistors have the same widths and lengths as one another.

10. The voltage-divider circuit as claimed in claim 1, wherein for one, some or all of the discrete resistors of the voltage-divider circuit, each of those discrete resistors is part of a discrete impedance or connected in parallel with a corresponding capacitor.

11. Voltage-divider circuitry, comprising at least two voltage-divider circuits as claimed in claim 1 connected together.

12. Voltage regulation circuitry, comprising the voltage-divider circuit as claimed in claim 1.

13. Analogue-to-digital circuitry or digital-to-analogue circuitry, comprising the voltage-divider circuit as claimed in claim 1.

14. Integrated circuitry comprising the voltage-divider circuit as claimed in claim 1.

15. Analogue-to-digital circuitry or digital-to-analogue circuitry, comprising the voltage-divider circuitry of claim 11.

16. Analogue-to-digital circuitry or digital-to-analogue circuitry, comprising the voltage regulation circuitry of claim 12.

17. Integrated circuitry comprising the voltage-divider circuitry of claim 11.

18. Integrated circuitry comprising the voltage regulation circuitry of claim 12.

19. Integrated circuitry comprising the analogue-to-digital circuitry or digital-to-analogue circuitry of claim 13.

20. A voltage-divider circuit, comprising:
a network of discrete resistors connected together to define T tiers of resistors, where T≥2, the T tiers comprising first and subsequent tiers, each subsequent tier nested within the preceding tier, the Xth tier comprising at least one Xth-tier resistor where X=1, and the Xth tier comprising at least two Xth-tier resistors for each value of X in the range $2 \leq X \leq T$, wherein, for each value of X in the range $1 \leq X < T$:

each Xth-tier resistor is connected between a pair of nodes of the voltage-divider circuit at which a relatively high voltage signal and a relatively low voltage signal are provided, respectively;

at least one Xth-tier resistor is implemented as a subdivision network of discrete resistors; and for each Xth-tier resistor implemented as a subdivision network, that subdivision network comprises a main resistor connected in series with a corresponding auxiliary resistor, that main resistor implemented as a base resistor connected in parallel with a series connection of a plurality of X+1th-tier resistors such that voltages at terminals of the base resistor are the same as respective voltages at end terminals of the series connection of resistors, and wherein for at least one said subdivision network:

its said series connection of resistors in implemented as S of those resistors;

the auxiliary resistor is implemented as M resistors connected together in parallel;

the base resistor, the S resistors of its said series connection of resistors and the M resistors which implement its auxiliary resistor all have the same resistance value; and $M \geq 3$ and $M = S+1$.

\* \* \* \* \*